(12) United States Patent
Bunce et al.

(10) Patent No.: US 10,840,895 B1
(45) Date of Patent: Nov. 17, 2020

(54) FINE-GRAINED PROGRAMMABLE DELAY AND PULSE SHAPING CIRCUIT

(71) Applicant: INTERNATIONAL BUSINESS MACHINES CORPORATION, Armonk, NY (US)

(72) Inventors: Paul Alan Bunce, Poughkeepsie, NY (US); John Davis, Wallkill, NY (US); Brian James Yavoich, Highland, NY (US); Russell Hayes, New Paltz, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/562,584

(22) Filed: Sep. 6, 2019

(51) Int. Cl.
| | |
|---|---|
| *H03K 5/133* | (2014.01) |
| *H03K 5/04* | (2006.01) |
| *H03K 5/1534* | (2006.01) |
| *H03K 5/00* | (2006.01) |

(52) U.S. Cl.
CPC ............ *H03K 5/133* (2013.01); *H03K 5/04* (2013.01); *H03K 5/1534* (2013.01); *H03K 2005/00058* (2013.01)

(58) Field of Classification Search
CPC ........ H03K 5/131; H03K 5/133; H03K 5/134; H03K 2005/00065; H03K 2005/00071; H03K 2005/00058; H03K 2005/00019; H03K 2005/00078; H03K 2005/00084; H03K 2005/00032; H03K 2005/00039; H03K 2005/00195; H03K 2005/00215; H03K 2005/00221; H03K 5/04–065; H03K 5/12
See application file for complete search history.

(56) References Cited

U.S. PATENT DOCUMENTS

| | | | | |
|---|---|---|---|---|
| 6,034,557 A * | 3/2000 | Schultz | ................. | H03K 5/133 327/276 |
| 6,191,630 B1 * | 2/2001 | Ozawa | ................. | H03K 3/0231 327/172 |
| 6,573,777 B2 * | 6/2003 | Saint-Laurent | ...... | H03H 11/265 327/270 |
| 6,956,420 B2 * | 10/2005 | Slawecki | ............... | H03K 5/153 327/172 |
| 7,208,991 B2 * | 4/2007 | Carley | ................. | H03K 5/133 327/158 |

(Continued)

OTHER PUBLICATIONS

"5 Gb/s programmable digital delay line—model PDDL5", GigaBaudics, URL: http://www.gigabaudics.com/PDDL5/pddl5.html. Retrieved May 14, 2019. 4 pages.

(Continued)

*Primary Examiner* — Thomas J. Hiltunen
(74) *Attorney, Agent, or Firm* — Cantor Colburn LLP; William Kinnaman (57) ABSTRACT

According to one or more embodiments of the present invention, a delay circuit includes a first sub-circuit that delays a leading edge of an input signal according to first control settings, the input signal being for an electric device. The delay circuit further includes a second sub-circuit that delays a trailing edge of the input signal according to second control settings. An output signal from the delay circuit is received by the electric device.

9 Claims, 9 Drawing Sheets

(56) References Cited

U.S. PATENT DOCUMENTS

| | | | | |
|---|---|---|---|---|
| 7,453,297 | B1* | 11/2008 | Kaviani | G06F 1/10 |
| | | | | 327/149 |
| 7,525,364 | B2* | 4/2009 | Ariyoshi | H03L 7/0805 |
| | | | | 327/155 |
| 8,278,986 | B2* | 10/2012 | Bettini | H03K 5/131 |
| | | | | 327/158 |
| 8,933,738 | B2* | 1/2015 | Wu | H03K 5/1565 |
| | | | | 327/175 |
| 8,949,652 | B2* | 2/2015 | Lee | H03K 5/131 |
| | | | | 713/503 |
| 9,369,118 | B2* | 6/2016 | Nakata | H03K 5/1565 |
| 9,859,880 | B2* | 1/2018 | Chae | H03K 5/13 |
| 10,437,472 | B2* | 10/2019 | Bhuiyan | G11C 29/028 |
| 2001/0043652 | A1 | 11/2001 | Hooley | |
| 2003/0214339 | A1* | 11/2003 | Miyamoto | H03H 11/265 |
| | | | | 327/276 |
| 2004/0066223 | A1 | 4/2004 | Tang | |
| 2005/0218953 | A1 | 10/2005 | Slawecki | |
| 2008/0180150 | A1 | 7/2008 | Yamamoto | |
| 2013/0176062 | A1* | 7/2013 | Wang | H03K 5/131 |
| | | | | 327/161 |
| 2014/0063917 | A1* | 3/2014 | Singh | G11C 11/419 |
| | | | | 365/154 |
| 2017/0337952 | A1* | 11/2017 | Shi | G11C 7/10 |
| 2019/0190451 | A1* | 6/2019 | D'Alessandro | H03B 27/00 |

OTHER PUBLICATIONS

"Monolithic 8-BIT programmable delay line (Series 3D7418—Low noise)", DigChip, Retrieved May 14, 2019. URL: https://www.digchip.com/datasheets/parts/datasheet/120/3D7418S.php. 4 pages.
Transmittal Form PTO/SB/21, filed Mar. 18, 2020.

\* cited by examiner

FINE-GRAINED PROGRAMMABLE DELAY AND PULSE SHAPING CIRCUIT

BACKGROUND

The present invention generally relates to electrical circuits and particularly to a clock adjusting method for the electrical circuit. In one or more examples, the clock adjusting can be used as part of a test apparatus to compensate for a delay variation between clock operation circuits in the electrical circuit in order to achieve an improvement in an inspection quality as well as a reduction in cost.

Delay elements are electrical circuits that are used as part of other electrical circuits. Some examples of using the delay elements include, tuning—synchronizing arrival time of multiple signals, cycle steal—setup time relief for driving logic, and padding—increasing latch hold time margins. Fixed delay elements can adjust signal arrival times; however, physical design changes are required to vary the delay. Programmable delay elements are desirable to dynamically adjust the delay. Such dynamic adjustments can be used to adjust signal arrival times, stress design margins during test, and fix hardware timing issues. Programmable delay elements are desired so as to avoid physical design changes to the electrical circuit.

SUMMARY

According to one or more embodiments of the present invention, a delay circuit includes a first sub-circuit that delays a leading edge of an input signal according to first control settings, the input signal being for an electric device. The delay circuit further includes a second sub-circuit that delays a trailing edge of the input signal according to second control settings. An output signal from the delay circuit is received by the electric device.

According to one or more embodiments of the present invention, a system includes a device that receives an input signal, and a delay circuit coupled with the device. The delay circuit adjusts the input signal being received by the device. The delay circuit includes a first sub-circuit that delays a leading edge of the input signal according to first control settings. The delay circuit further includes a second sub-circuit that delays a trailing edge of the input signal according to second control settings.

According to one or more embodiments of the present invention, a method includes receiving, by a delay circuit, an input signal for an electric device. The method further includes delaying, by the delay circuit, a leading edge of the input signal according to first control settings resulting in a delayed signal. The method further includes receiving, by the device, the delayed signal from the delay circuit.

The above-described features can also be provided at least by a system, a computer program product, and a machine, among other types of implementations.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

As noted herein, programmable delay elements are desirable to facilitate adjusting signal arrival times, stress design margins during test, fix hardware timing issues, and avoid physical design changes. In an integrated circuit, such as a microprocessor, a programmable delay circuit (or element) may be used for debugging and performance tuning, particularly in self-timed circuits, such as pulsed Local Clock Buffers (LCBs), array dynamic circuitry, or clock deskewers. LCBs are used for driving local clock signals in microprocessor designs. A programmable delay circuit receives an input signal, which may be a clock signal or a data signal, and outputs a signal having a specified delay based on the input signal and one or more control inputs. The delay of the output signal that is output by the programmable delay circuit may be varied by varying the control inputs.

In one or more examples, the programmable delay elements can also be used as a pulse shaper. A pulse shaper is an electrical circuit that can be used in macro and logic design for pulse expansion and chopping. Pulsing is typically done with fixed delay circuits or skewed logic with a fixed design and physical design changes to vary the pulse shape. A programmable shaper is desirable.

Existing solutions typically provide programmable delay by multiplexing logic delays of varying length. However, in such existing solutions, controllable settings are coarse, and the programmable delays are limited to a minimum of two logic stage delays. Using two logic stage delays can lead to about 10% delay of the total cycle of a high frequency design, as an example. Further, existing solutions may limit programmability to varying only one edge of the input signal.

Embodiments of the present invention address such technical challenges and facilitate a fine-grained delay circuit that can be used as a pulse shaper. The delay circuits according to one or more embodiments of the present invention facilitate delaying both edges of an input signal, which can in turn facilitate using the delay circuit as a cycle steal block in one or more embodiments of the present invention. The two edges—falling edge and rising edge—of the input signal can be delayed (varied) equally, or separately using the fine-grained control settings. Further, according to one or more embodiments of the present invention, the delay circuit includes an "enable" pin with a corresponding control setting, where setting enable=0 bypasses the programmed delay. In extension, enable=1 delays the input signal according to the control settings of the delay circuit.

Figure 1:
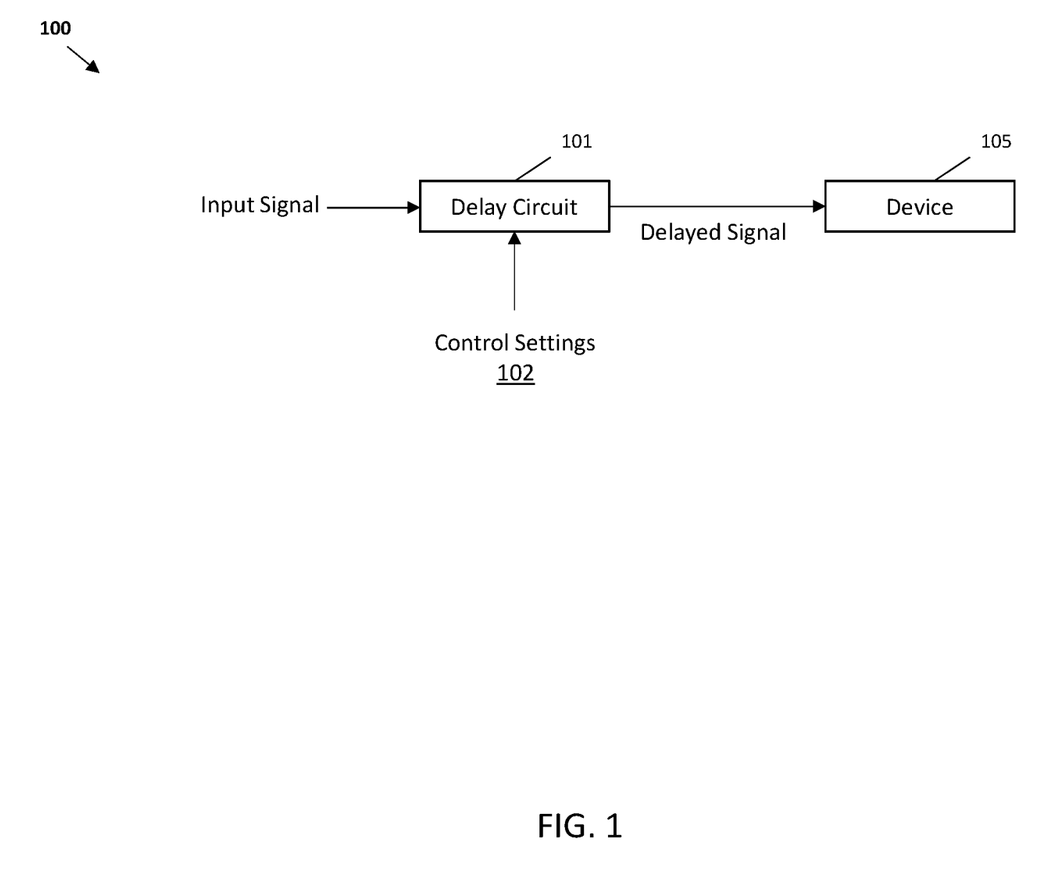
FIG. 1 depicts a block diagram of a programmable delay circuit being used according to one or more embodiments of the present invention.

FIG. 1 depicts a block diagram of a programmable delay circuit being used according to one or more embodiments of the present invention. In the depicted example electrical system 100, a programmable delay circuit 101 (henceforth "delay circuit") is used to delay an input signal being provided to an electrical device 105. The delay circuit 101 delays the input signal according to one or more control settings 102.

It is understood that the depicted block diagram can represent various example scenarios. For example, the electrical device 105 can be a random access memory (RAM) device, such as a static RAM, and the delay circuit 101 can include be a pulse width controller. Further, it should be noted that while the electrical device 105 and the delay circuit 101 are shown separately, in one or more examples, the delay circuit 101 can be an integral part of the electrical device 105.

Figure 2:
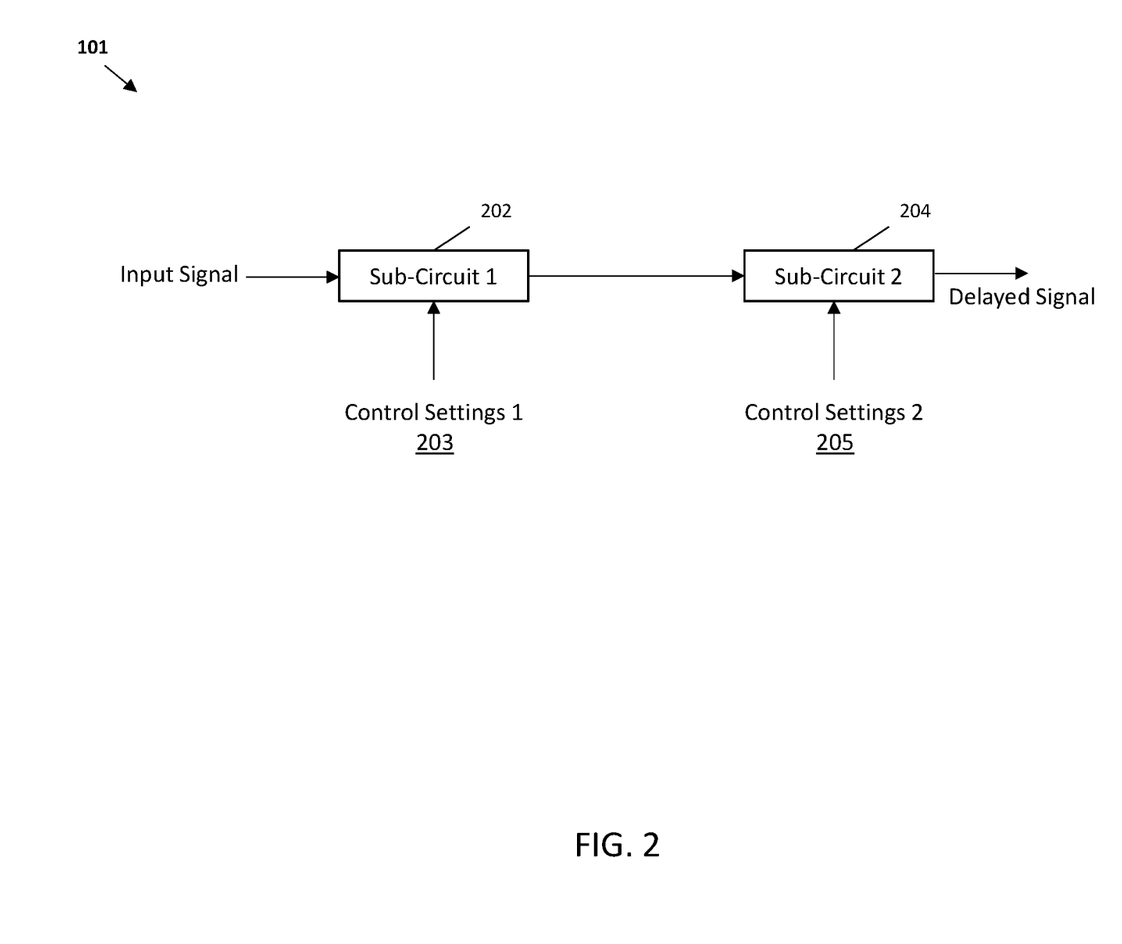
FIG. 2 depicts a block diagram of one or more components of the delay circuit according to one or more embodiments of the present invention.

FIG. 2 depicts a block diagram of one or more components of the delay circuit 101 according to one or more embodiments of the present invention. The delay circuit 101 can include one or more delay sub-circuits. In the depicted example, the delay circuit 101 includes two delay sub-circuits in series—a first sub-circuit 202 and a second sub-circuit 204. The control settings 102 of FIG. 1 include two sets of control settings for each respective sub-circuit. The first sub-circuit 202 delays the input signal according to first control settings 203 and the second sub-circuit 204 delays the input signal according to second control settings 205. It should be noted that although two sub-circuits are shown in this example, in other embodiments of the present invention, the delay circuit 101 can include a different number of delay sub-circuits with respective control settings.

Figure 3:
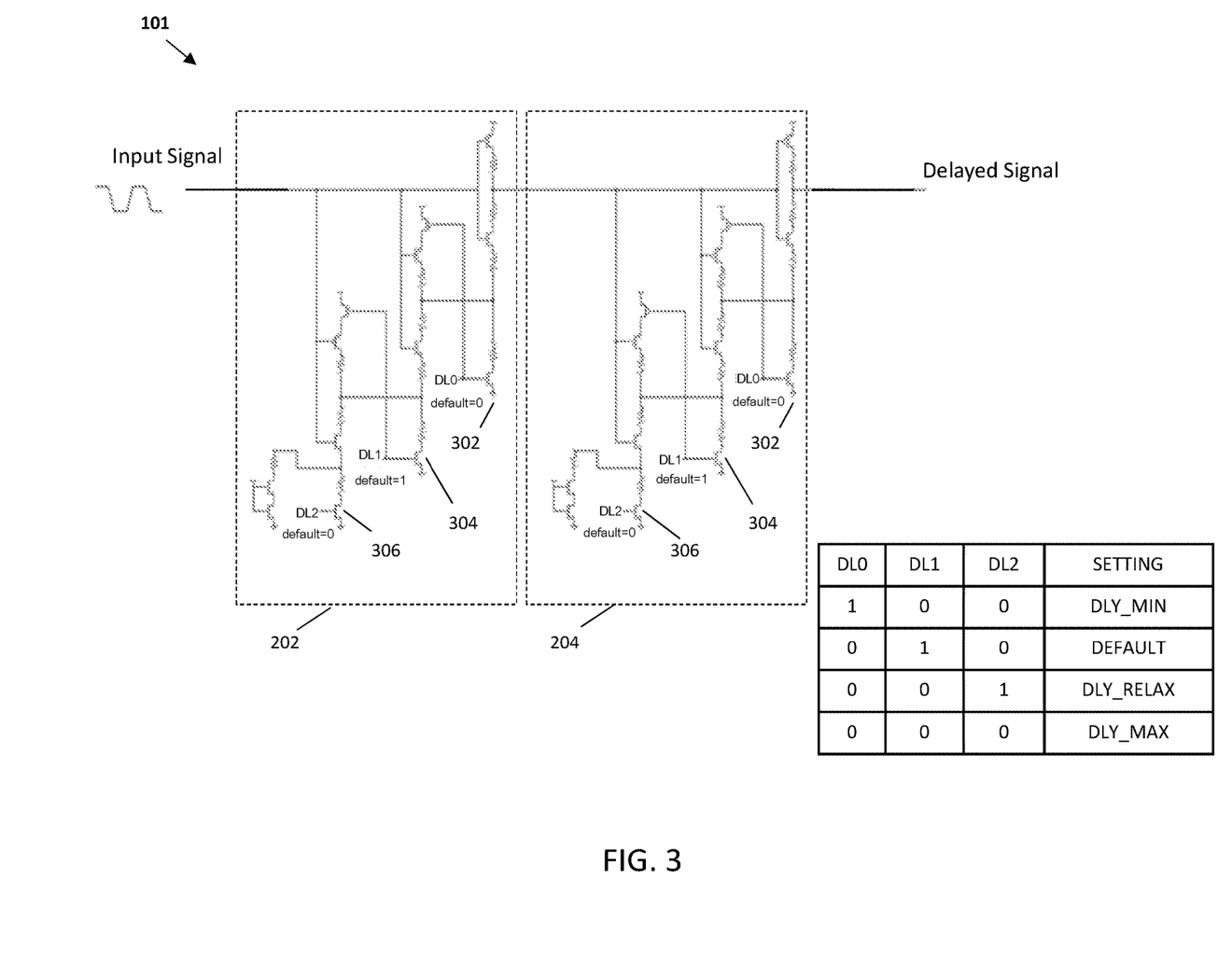
FIG. 3 depicts an expanded view of the delay circuit according to one or more embodiments of the present invention.

FIG. 3 depicts an expanded view of the delay circuit 101 according to one or more embodiments of the present invention. Here, the delay sub-circuits 202, 204, each include a combination of transistors DL0 302, DL1 304, and DL2 306, to cause a delay in the input signal. It is understood that although the example depicted uses n-channel field effect transistors (NFETs), in other examples, the delay sub-circuits can include other types of transistors, such as p-channel field effect transistors (PFETs), junction field effect transistors (JFETs), and the like.

The control settings 102 determine the delay introduced by each of the delay sub-circuits 202, 204. The control settings 102 include a setting value for each of the transistor 302 in the sub-circuits. The transistors 302, 304, 306, each have a default setting value that can be overridden by providing a particular setting value. According to the example control settings 102 shown, a sub-circuit with control settings set to DL0=1, DL1=0, DL2=0, provides a minimum delay of −10 picoseconds, whereas control settings set to DL0=0, DL1=0, DL2=0, provides a maximum delay of 20 picoseconds. Other control settings provide different delays. It is understood that the delay values are examples, and that in one or more embodiments of the present invention the delay values corresponding to the control settings 102 can be different than those depicted herein.

In the example shown, with the two sub-circuits 202, 204, the delay circuit 101 delays both edges of the input signal according to the control settings of each sub-circuit. If the control settings of each of the sub-circuits 202, 204, are equal, the delay circuit 101 provides equal delay for both edges of the input signal. The delay circuit 101 can be used as a cycle steal block using such control setting values. As can be seen, by using a combination of the control setting values, fine-grained control of the delay can be achieved. In the example shown in FIG. 3, the "delay" can cause the input signal to be faster in one setting, whereas two settings cause the input signal to be slower by different durations.

Alternatively, in one or more embodiments of the present invention the falling (trailing) and rising (leading) edges of the input signal are delayed separately. To this end, separate control bits, i.e. setting values, are used for each delay sub-circuit 202, 204, respectively. In one or more examples, the delay circuit 101 can use different default values for each of the transistors in the delay sub-circuits for each edge of the input signal to be delayed separately. By varying the delay for each edge of the input signal independently, the delay circuit 101 facilitates shaping the input signal. For example, the delay circuit 101 can operate as a pulse stretcher, pulse chopper, or any other pulse shaper.

Figure 4:
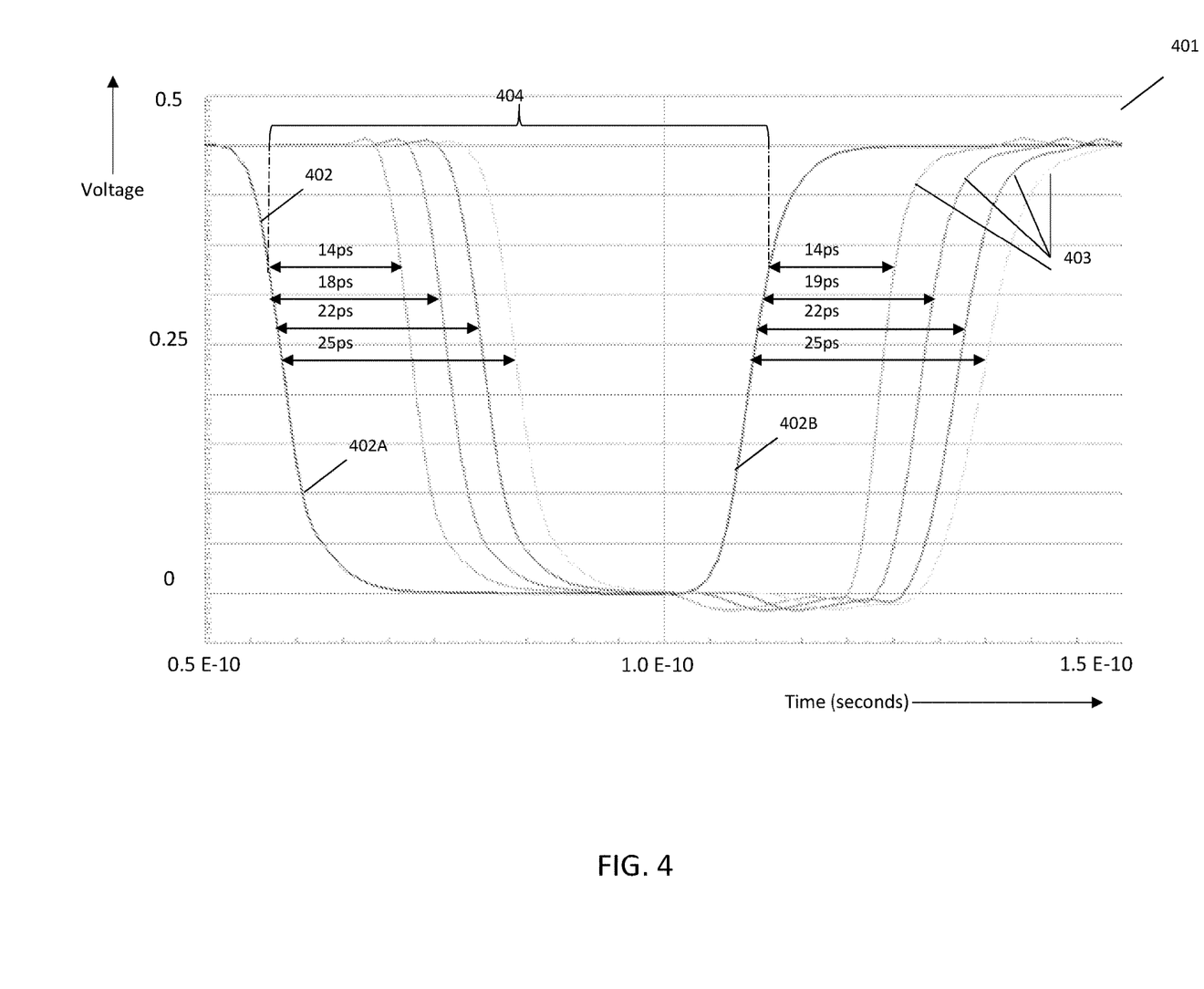
FIG. 4 depicts example delays introduced by the delay circuit according to one or more embodiments of the present invention.

FIG. 4 depicts example delays introduced by the delay circuit 101 according to one or more embodiments of the present invention. In plot 401, an input signal 402 is delayed using equal delay programming for the leading edge 402A and the trailing edge 402B to keep pulse width 404 the same for the input signal 402 and the corresponding delayed signal 403. It will be understood that the time values illustrated in FIG. 4 are examples and many timing variations can be achieved beyond those depicted.

Figure 5:
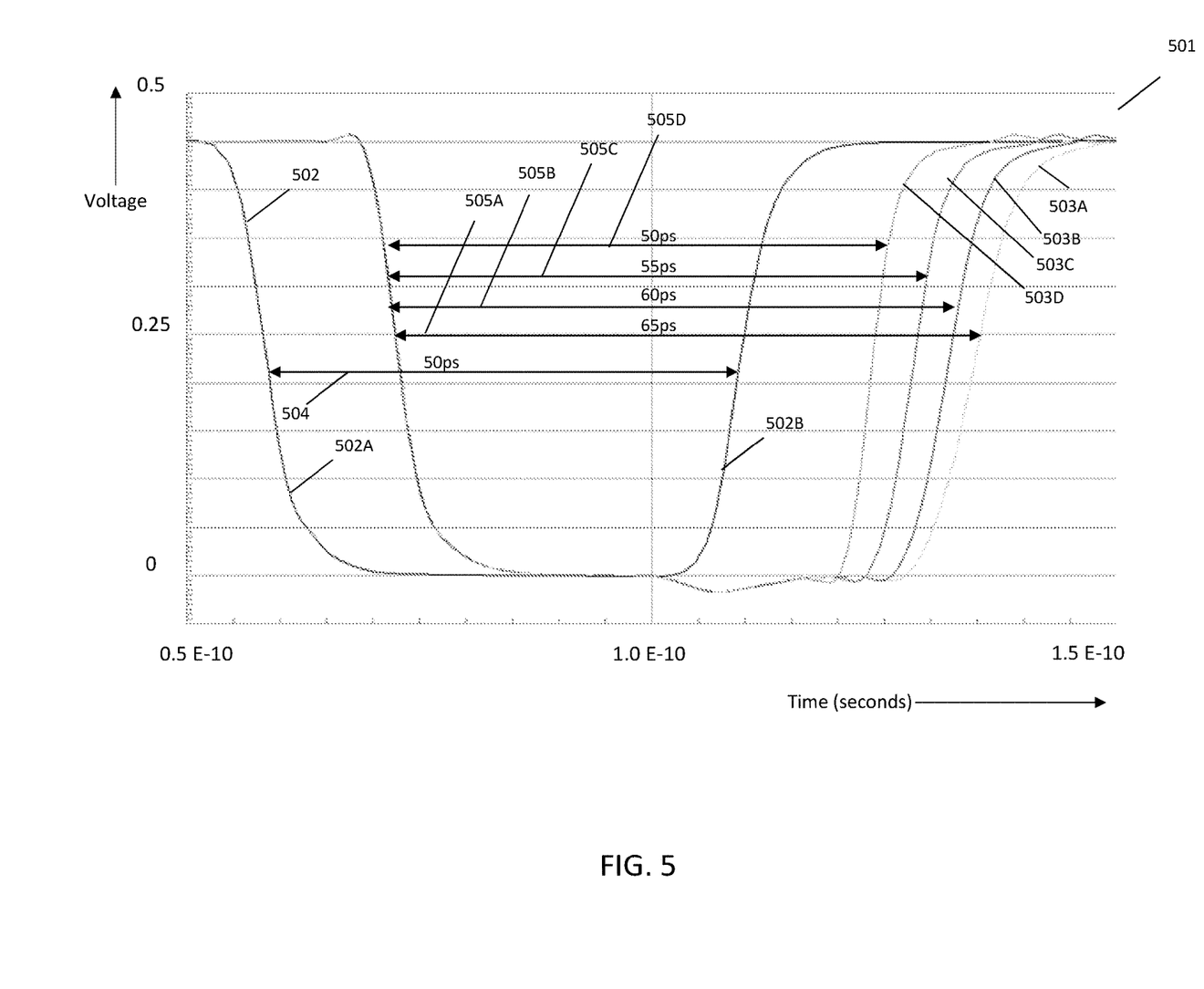
FIG. 5 depicts example delays introduced by the delay circuit according to one or more embodiments of the present invention.

FIG. 5 depicts example delays introduced by the delay circuit 101 according to one or more embodiments of the present invention. In plot 501, an input signal 502 is delayed using a first delay programming for the leading edge 502A and a second delay programming for the trailing edge 502B. In FIG. 5, various examples are depicted with varying trailing edge programming to expand the delayed signal, for example delayed signals 503A-D. By varying only the trailing edge 502B, the pulse width 504 of the input signal is changed to different pulse widths (505A-D) corresponding to the introduced delays. It is understood that the delays shown in FIG. 5 are examples and that in one or more embodiments of the present invention the delays can be programmed to be different than those shown here. The delay circuit 101 accordingly can be operated as a pulse expander by delaying the trailing edge 502B only, or in general, by delaying the trailing edge 502B more than the leading edge 502A. The expander results in the pulse width of the delayed signal 503A-D to be more than the pulse width of the input signal 502.

Figure 6:
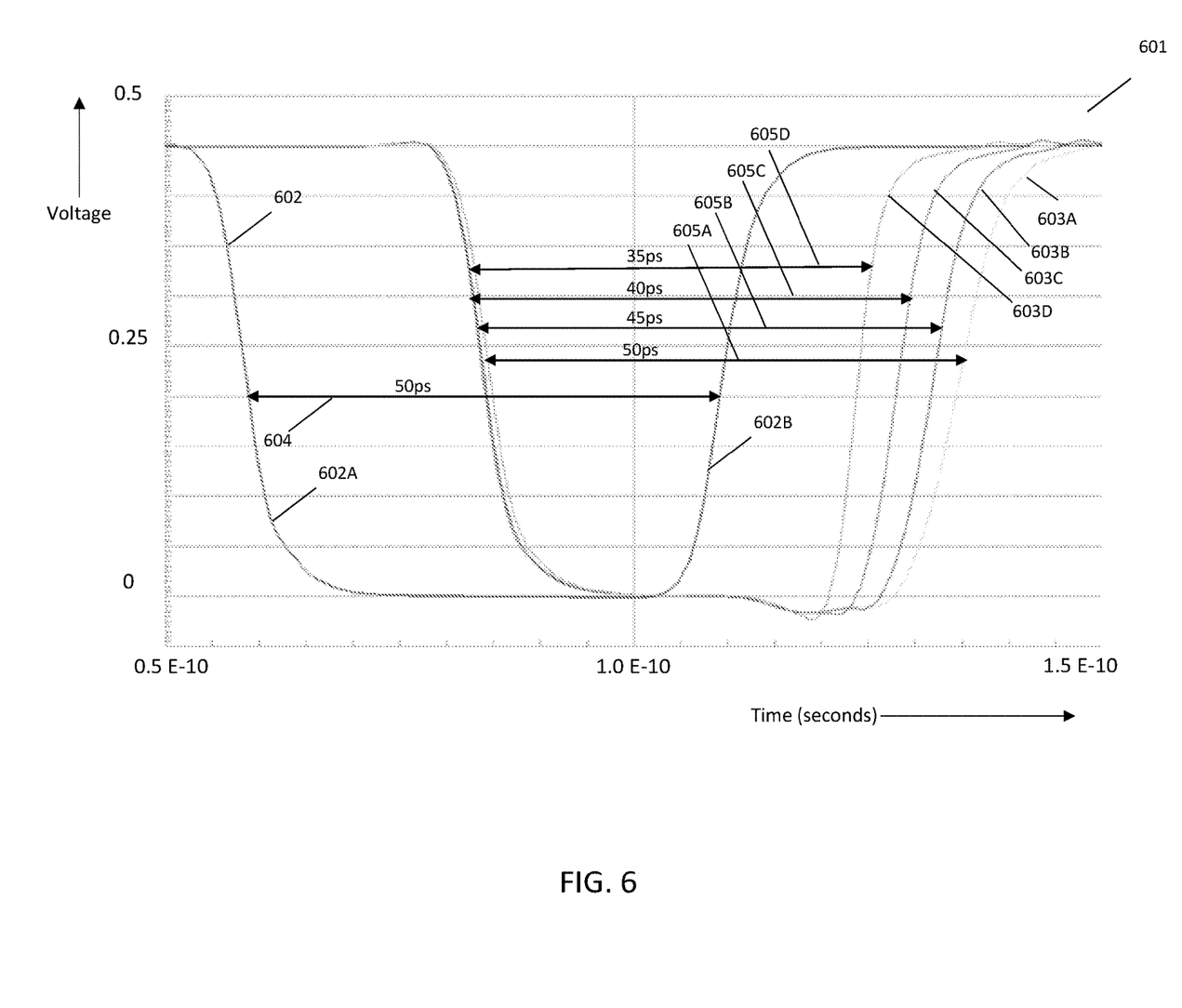
FIG. 6 depicts example delays introduced by the delay circuit according to one or more embodiments of the present invention.

FIG. 6 depicts example delays introduced by the delay circuit 101 according to one or more embodiments of the present invention. In plot 601, an input signal 602 is delayed using a first delay programming for the leading edge 602A and a second delay programming for the trailing edge 602B. In FIG. 6, various examples are depicted with varying trailing edge programming to compress the delayed signal, for example, delayed signals 603A-D. By varying only the trailing edge 602B, the pulse width 604 of the input signal 602 is changed to a different pulse widths (605A-D) corresponding to the introduced delays. In general, the pulse is chopped by delaying the trailing edge 602B less than the leading edge 602A. It is understood that the delays shown in FIG. 6 are examples and that in one or more embodiments of the present invention the delays can be programmed to be different than those shown here.

Figure 7:
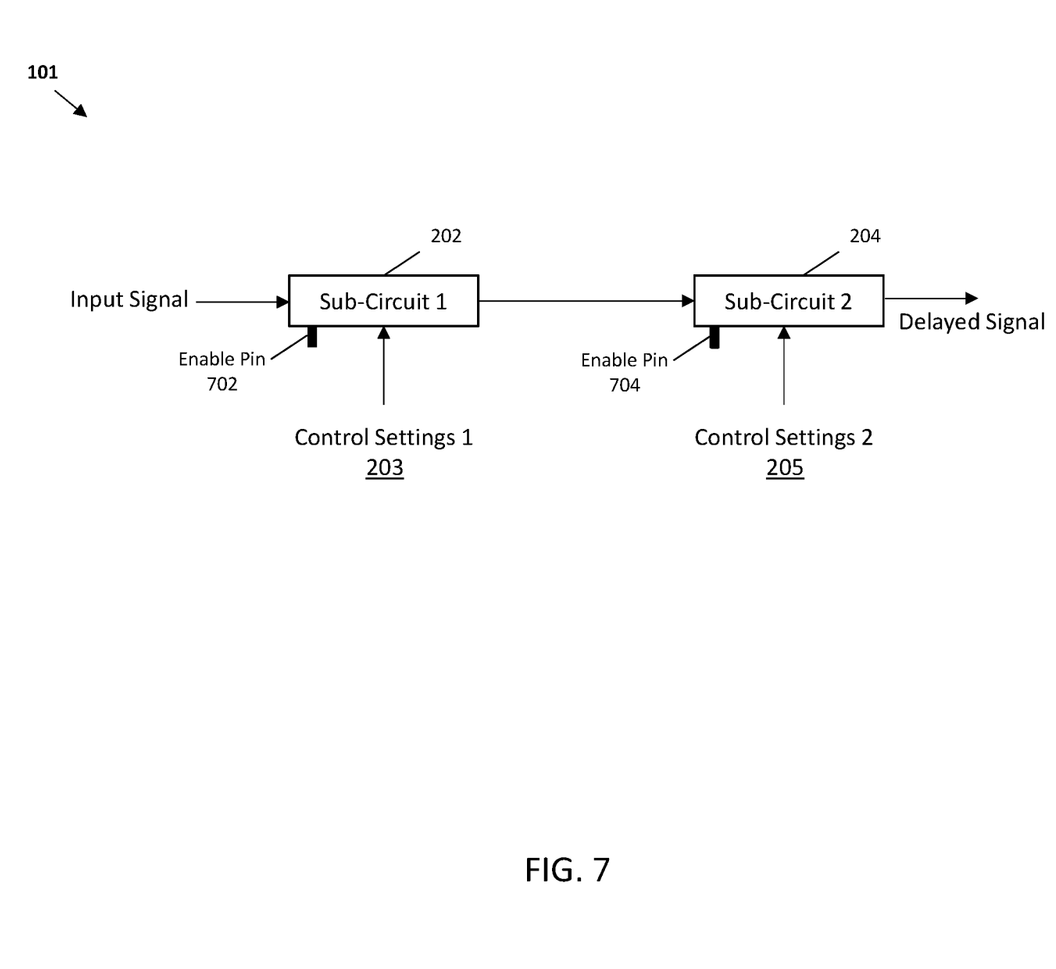
FIG. 7 depicts a block diagram of one or more components of the delay circuit according to one or more embodiments of the present invention.

FIG. 7 depicts a block diagram of one or more components of the delay circuit 101 according to one or more embodiments of the present invention. In the depicted example, the delay sub-circuits 202, 204, each include an enable pin 702, 704, respectively. Each of the enable pins 702, 704, facilitates bypassing the corresponding delay sub-circuits 202, 204 based on being set to a predetermined value. For example, by setting a control value ENABLE=0 for enable pin 702, the delay sub-circuit 202 is bypassed. Accordingly, in this case, the input signal is delayed only by the delay sub-circuit 204 as per the control settings 205. The second delay sub-circuit 204 can be bypassed by setting a control value ENABLE=0 for the enable pin 704. It should be noted that ENABLE=1, can be used for bypassing a sub-circuit in other examples.

In one or more embodiments of the present invention, where the delay circuit 101 includes multiple delay sub-circuits, one or more of the delay sub-circuits can be bypassed by setting the corresponding enable pins to the bypass control setting.

Figure 8:
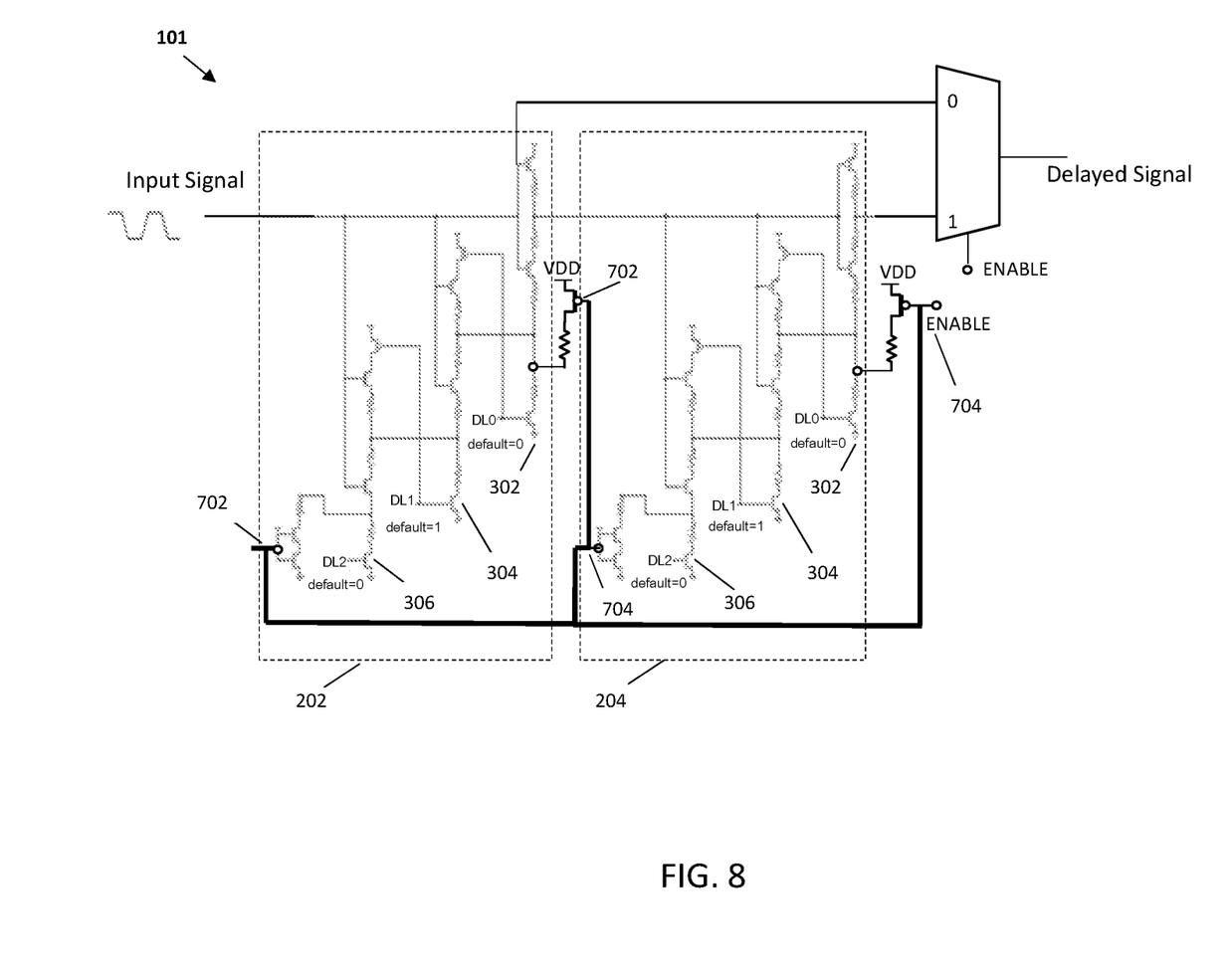
FIG. 8 depicts an expanded view of the delay circuit according to one or more embodiments of the present invention.

FIG. 8 depicts an expanded view of the delay circuit with an enable pin according to one or more embodiments of the present invention. In one or more embodiments of the present invention the enable pins (702, 704) of all the delay sub-circuits are shorted together. In such cases, all the sub-circuits are bypassed together (not individually bypassed) depending on the control value ENABLE provided on the common enable pin, say enable pin 702.

Figure 9:
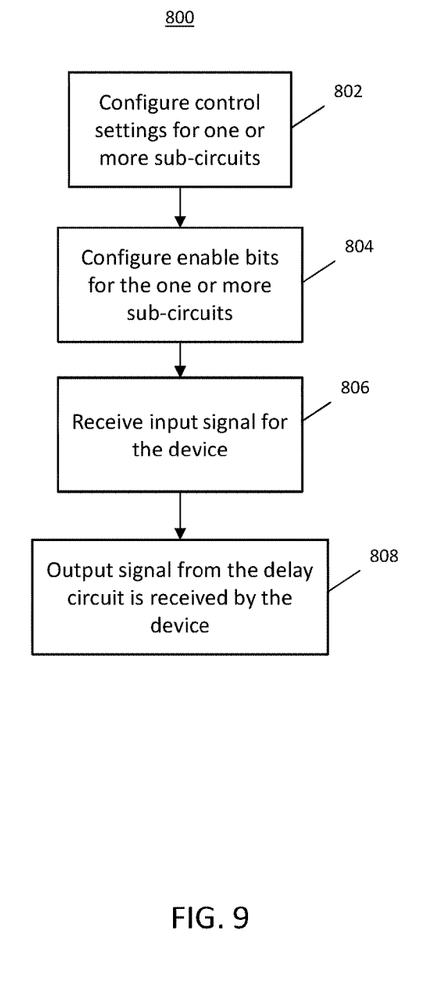
FIG. 9 depicts a flowchart for a method to delay an input signal using a delay circuit according to one or more embodiments of the present invention.

FIG. 9 depicts a flowchart 800 for a method to delay an input signal using a delay circuit according to one or more embodiments of the present invention. The method includes configuring the control settings 102 for sub-circuits in the delay circuit 101, at block 802. The configuring can include configuring the first control settings 203 for the first sub-circuit 202 and the second control settings 205 for the second sub-circuit 204. In the case there are other sub-circuits, the control settings can be adjusted for those as well. The configuring can include adjusting control settings for the first sub-circuit 202 to be the same as the second sub-circuit 204.

Further, the enable control bits can be set for the one or more sub-circuits in the delay circuit 101, at block 804. The enable control bits are configured to bypass one or more sub-circuits.

The method further includes receiving the input signal for the device 105, at block 806. The input signal is delayed according to the control settings of the delay circuit 101 and the enable control bits of the delay circuit 101. The output signal from the delay circuit 101 is received by the device 105, at block 808. The signal received by the device 105 can have a different pulse shape from that of the input signal if the leading edge and trailing edge of the input signal are delayed differently by the delay circuit 101. The different shape can include the signal received by the device 105 having a different pulse width than that of the input signal. Alternatively, if the leading edge and the trailing edge are delayed equally by the delay circuit 101, the shape of the signal received by the device 105 is the same as that of the input signal, however, it is delayed.

Accordingly, one or more embodiments of the present invention facilitate a programmable delay and pulse shaping circuit with settings to vary a rise-rise delay and a fall-fall delay either synchronously or separately. The programmable delay and pulse shaping circuit provides fine-grained variations in delay and pulse width. The programmable delay and pulse shaping circuit facilitates delay settings for both faster and slower than a default delay. The programmable delay and pulse shaping circuit with delay settings can provide both, a wider and a narrower pulse width than a pulse width of the input signal. The programmable delay and pulse shaping circuit, using the adjustable control settings facilitates variation of delay without re-designing the circuit. The programmable delay and pulse shaping circuit also facilitates variation of pulse shaping without re-designing the circuit.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source-code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A delay circuit comprising:
   a first sub-circuit that delays a leading edge of an input signal according to first control settings that are received via a first set of input terminals, the input signal being for an electric device;
   a second sub-circuit that delays a trailing edge of the input signal according to second control settings that are received via a second set of input terminals, wherein the first control settings are different from the second control settings, and wherein the first control settings delay the leading edge of the input signal by a first value, the second control settings delay the trailing edge of the input signal by a second value; and
   a first enable pin associated with the first sub-circuit, and a second enable pin associated with the second sub-circuit, wherein the first sub-circuit is bypassed in response to the first enable pin being set to a predetermined value, and the second sub-circuit is bypassed in response to the second enable pin being set to the predetermined value, wherein the first enable pin of the first sub-circuit and the second enable pin of the second sub-circuit are shorted together to bypass both, the first sub-circuit and the second sub-circuit, using a common signal; and
   wherein an output signal from the delay circuit is received by the electric device.

2. The delay circuit of claim 1, wherein the first value is more than the second value, and causes a decrease in pulse width of the input signal.

3. The delay circuit of claim 1, wherein the first value is less than the second value, and causes an increase in pulse width of the input signal.

4. A system comprising:
   a device configured to receive an input signal; and
   a delay circuit coupled with the device, the delay circuit adjusts the input signal being received by the device, the delay circuit comprising:
   a first sub-circuit that delays a leading edge of the input signal according to first control settings;
   a second sub-circuit that delays a trailing edge of the input signal according to second control settings, wherein the first control settings are different from the second control settings, and wherein the first control settings delay the leading edge of the input signal by a first value, the second control settings delay the trailing edge of the input signal by a second value; and
   a first enable pin associated with the first sub-circuit, and a second enable pin associated with the second sub-circuit, wherein the first sub-circuit is bypassed in response to the first enable pin being set to a predetermined value, and the second sub-circuit is bypassed in response to the second enable pin being set to the predetermined value, wherein the first enable pin of the first sub-circuit and the second enable pin of the second sub-circuit are shorted together to bypass both, the first sub-circuit and the second sub-circuit, using a common signal.

5. The system of claim 4, wherein the first value is more than the second value, and causes a decrease in pulse width of the input signal.

6. The system of claim 4, wherein the first value is less than the second value, and causes an increase in pulse width of the input signal.

7. A method comprising:
   receiving, by a delay circuit, an input signal for an electric device;
   bypassing, by the delay circuit, a first sub-circuit that delays a leading edge of the input signal according to first control settings, the first sub-circuit is bypassed based on a first enable pin that is associated with the first sub-circuit receiving a first predetermined value;
   delaying, by the delay circuit, a trailing edge of the input signal using a second sub-circuit according to second control settings resulting in a delayed signal, wherein a second enable pin that is associated with the second sub-circuit receives a second predetermined value wherein the first enable pin of the first sub-circuit and the second enable pin of the second sub-circuit are shorted together to bypass both, the first sub-circuit and the second sub-circuit, using a common signal, wherein the first control settings are different from the second control settings, and wherein the first control settings delay the leading edge of the input signal by a first value, the second control settings delay the trailing edge of the input signal by a second value; and
   receiving, by the device, the delayed signal from the delay circuit.

8. The method of claim 7, wherein the first value is more than the second value, and causes a decrease in pulse width of the input signal.

9. The method of claim 7, wherein the first value is less than the second value, and causes an increase in pulse width of the input signal.

* * * * *